United States Patent
Kahlmann

(10) Patent No.: US 6,597,297 B1
(45) Date of Patent: Jul. 22, 2003

(54) ENCODING/DECODING N-BIT SOURCE WORDS INTO CORRESPONDING M-BIT CHANNEL WORDS, AND VICE VERSEA, SUCH THAT THE CONVERSION IS PARTY INVERTING

(75) Inventor: Josephus A. H. M. Kahlmann, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/523,798

(22) Filed: Mar. 13, 2000

(30) Foreign Application Priority Data

Mar. 12, 1999 (EP) .............................................. 99200756

(51) Int. Cl.[7] .................................................. H03M 7/00
(52) U.S. Cl. ......................................... 341/102; 341/58
(58) Field of Search ............................. 341/95, 68, 69, 341/58, 67, 102

(56) References Cited

U.S. PATENT DOCUMENTS 5,278,902 A 1/1994 Nugent ........................ 380/42
5,477,222 A 12/1995 Kahlman et al. ............. 341/95

OTHER PUBLICATIONS

U.S. patent application Ser. No. 09/867,895, Kahlman, filed May 2001.*

* cited by examiner

Primary Examiner—Brian Young
(74) Attorney, Agent, or Firm—Michael E. Belk

(57) ABSTRACT

An encoder encodes a stream of date-bits of a binary source signal into a stream of date-bits of a binary channel signal, wherein the bitstream of the source signal is divided into n-bit source words. The encoder includes a converter for converting the source words into corresponding m-bit channel words. The converter converts n-bit source words into corresponding m-bit channel words, such that the conversion for each n-bit source word is parity inverting. The relations hold that $m > n \geq 1$, $p \geq 1$, and that p is an odd integer that can vary. Preferably, $m = n + 1$. A decoder decodes the channel signal, obtained by means of the encoder, to reproduce the source signal.

20 Claims, 3 Drawing Sheets

ENCODING/DECODING N-BIT SOURCE WORDS INTO CORRESPONDING M-BIT CHANNEL WORDS, AND VICE VERSEA, SUCH THAT THE CONVERSION IS PARTY INVERTING

FIELD OF THE INVENTION

The invention is related to the field of channel encoding digital bit streams for digital recording/reproducing.

BACKGROUND OF THE INVENTION

Encoding/decoding n-bit source words into corresponding m-bit channel words, and vice versa, such that the conversion is parity inverting.

The invention relates to a device for encoding a stream of databits of a binary source signal into a stream of databits of a binary channel signal, wherein the bitstream of the source signal is divided into n-bit source words, which device comprises converting means adapted to convert said source words into corresponding m-bit channel words and to a method. The invention also relates to a device for decoding a stream of data bits of a binary channel signal obtained by means of the encoding device, so as to obtain a stream of databits of a binary source signal.

An encoding device mentioned in the foregoing is known from the book 'Coding techniques for digital recorders' by K. A. Schouhamer Immink, chapter 5.6.7, pp. 127 to 131, Prentice Hall (1991). The book discusses an encoder for generating a (d,k) sequence which satisfies the parameters: rate 2/3, (1,7), which encoder is also proposed by Cohn et al in U.S. Pat. No. 4,337,458. Those skilled in the art are hereby directed to European Patent Application 199.088 A2 and U.S. Pat. No. 5,477,222 to Kahlmann et. al.

The above citations are hereby incorporated in whole by reference.

SUMMARY OF THE INVENTION

The known encoding scheme suffers from the presence of a DC level which may become excessively large and therefore introduces distortion in communication systems which can not handle a DC component, as well as distortion in any recording of data in magnetic media.

The invention has for its object to provide a device for encoding n-bit source words into corresponding m-bit channel words, such that it itself does not generate a DC component in the channel signal, whereas further it provides the possibility, by means of additional measures to be taken, to realize a channel signal in the form of a (d,k) sequence.

The device in accordance with the invention is characterized in that the converting means are adapted to convert a block of p consecutive n-bit source words into a corresponding block of p consecutive m-bit channel words, such that the conversion for each block of p consecutive n-bit source words is parity inverting, where h, m and p are integers, $m > n \geq 1$, $p \geq 1$, and where p is an odd integer and can vary. 'Parity inverting' means that the parity of the n-bit source words to be converted are the inverse of the parity (after modulo-2 addition) of the corresponding m-bit channel words in which they are converted. As a result, a unique relationship between the parity of the source words and the parity of the channel words can be obtained, enabling an efficient DC control for the binary channel signal, after aT precoding.

The encoding device in accordance with the invention can be used in combination with a bit-adder unit in which one bit is added to codewords of a certain length. The signal obtained can be applied to the encoding device of the present invention. The channel signal of the encoding device is applied to a 1T-precoder. The purpose of the bit-adder unit is to add a '0'- or a '1'-bit to blocks of data in the input signal of the converter, so as to obtain a precoder output signal which is DC free, or includes a tracking pilot signal having a certain frequency. The precoder output signal is recorded on a record carrier. The adding of a '0'-bit in the input signal of the converter results in the polarity of the output signal of the 1T precoder remaining the same. The adding of a '1'-bit results in a polarity inversion in the output signal of the 1T precoder. The converter therefore influences the output signal of the 1T precoder such that the running digital sum value of the output signal of the 1T precoder can be controlled so as to have a desired pattern as a finction of time.

Because of the fact that the encoding device in accordance with the invention realizes a parity-inverting encoding, it does not influence the polarity of the signal it encodes and can therefore be used in combination with the bit-adder unit without the need of any modification.

Preferably, m equals n+1, and n is equal to 2. For n being equal to 1 or 2, the device in accordance with the invention can be used, with additional measures to be taken, as will become apparent later, for generating channel signals in the form of a (d,k) sequence, where d=1. Higher values for n do not allow for the generation of a (1,k) sequence. Further, n=1, which means that 1-bit source words are converted into 2-bit channel words, results in an increase of 100% in bits in the channel signal generated by the device. Contrary to this a conversion of 2-bit source words into 3-bit channel words results in an increase of only 50%, and is therefore more advantageous.

Various conversions of 2-bit source words into 3-bit channel words are possible, that have the parity inverting character. One such conversions is the subject of claim 4. It should however be noted that various permutations of the channel codes in the table are possible, namely in total 4.

The device in accordance with the invention wherein the converting means are adapted to convert 2-bit source words into corresponding 3-bit channel words, so as to obtain a channel signal in the form of a (d,k) sequence, where d=1, the device further comprising means for detecting the position in the bitstream of the source signal where encoding of single 2-bit source words into corresponding single channel words would lead to a violation of the d-constraint at the channel word boundaries and for supplying a control signal in response to said detection, may be further characterized in that in the absence of the control signal, the converting means are adapted to convert single 2-bit source words into corresponding single 3-bit channel words, such that the conversion for each 2-bit source word is parity inverting. More specifically, the device is characterized in that, in the presence of said control signal, the converting means are further adapted to convert the block of said two subsequent 2-bit source words into a corresponding block of two subsequent 3-bit channel words, such that the conversion for said block of two subsequent 2-bit source words is parity preserving. The measure to convert one (say: the second one) of two subsequent source words into a 3-bit word not identical to the four channel words $CW_1$ to $CW_4$, offers the possibility to detect at the receiver side that a situation existed that encoding of single source words into corresponding single channel words would have led to a violation of the d=1 constraint. The encoder now encodes a block of two 2-bit source words into a block of 2 3-bit channel words, such that the encoding of the block is parity preserving, whilst the d=1 constraint is satisfied as well.

To embody the encoding of blocks of two 2-bit source words, the device in accordance with the invention may be characterized in that the converting means are adapted to convert the blocks of two consecutive 2-bit source words into the blocks of two consecutive 3-bit channel words in accordance with the coding given in the following table:

| block of 2 source words | block of 2 channel words |
|---|---|
| 01 01 | 100 010 |
| 01 00 | 101 010 |
| 11 01 | 000 010 |
| 11 00 | 001 010 |

The device in accordance with the invention, for generating a (d,k) sequence, wherein k has a value larger than 5, the device being further provided with means for detecting the position in the bitstream of the source signal where encoding of single 2-bit source words into single 3-bit channel words would lead to a violation of the k-constraint and for supplying a second control signal in response to said detection, may be further characterized in that, in the presence of the second control signal, occurring during the conversion of three consecutive 2-bit source words, the converting means are adapted to convert a block of said three consecutive 2-bit source words into a block of corresponding three consecutive 3-bit channel words, such that the conversion for said block of three 2-bit source words is parity inverting, the converting means are further adapted to convert two of the three source words in the block into corresponding 3-bit channel words not identical to the four channel words $CW_1$ to $CW_4$, in order to preserve the k constraint.

This measure enables an encoding of a block of three 2-bit source words into a block of three 3-bit channel words so as to satisfy the k-constraint, and such that the encoding is still parity inverting.

The measure to convert two (say: the second and the third one) of three subsequent source words into a 3-bit word not identical to the four channel words $CW_1$ to $CW_4$, offers the possibility to detect at the receiver side that a situation existed that the encoding of single 2-bit source words into corresponding single 3-bit channel words would have led to a violation of the k constraint. Upon detection, the decoder is capable of decoding the block of three 3-bit channel words into the corresponding block of three 2-bit source words in the inverse way, as upon encoding.

To embody the encoding of blocks of three 2-bit source words, the device in accordance with the invention may be characterized in that the converting means are adapted to convert blocks of three consecutive 2-bit source words into blocks of three consecutive 3-bit channel words in accordance with the coding given in the following table:

| block of 3 source words | block of 3 channel words |
|---|---|
| 10 10 10 | 000 010 010 |
| 10 10 11 | 001 010 010 |
| 00 10 11 | 101 010 010 |
| 00 10 10 | 100 010 010 |

A device for decoding a stream of data bits of a binary channel signal into a stream of databits of a binary source signal, wherein the bitstream of the channel signal is divided into m-bit channel words, which device comprises deconverting means adapted to deconvert m-bit channel words into corresponding n-bit source words, is characterized in that, the deconverting means are adapted to deconvert a block of p consecutive m-bit channel words into a corresponding block of p consecutive n-bit source words, such that the conversion for each block of p consecutive m-bit channel words is parity inverting, where n, m and p are integers, m>n, p≧1, and where p is an odd integer and can vary.

It should be noted that published European patent application 199.088A2 discloses a converter for converting n-bit source words into a channel signal in the form of a sequence of m-bit channel words, which channel signal is DC free. The conversion is however not parity inverting.

The invention will be further described in the following figure description, in which

DETAILED DESCRIPTION OF THE PREFERRED EMBODIMENTS

Figure 1:
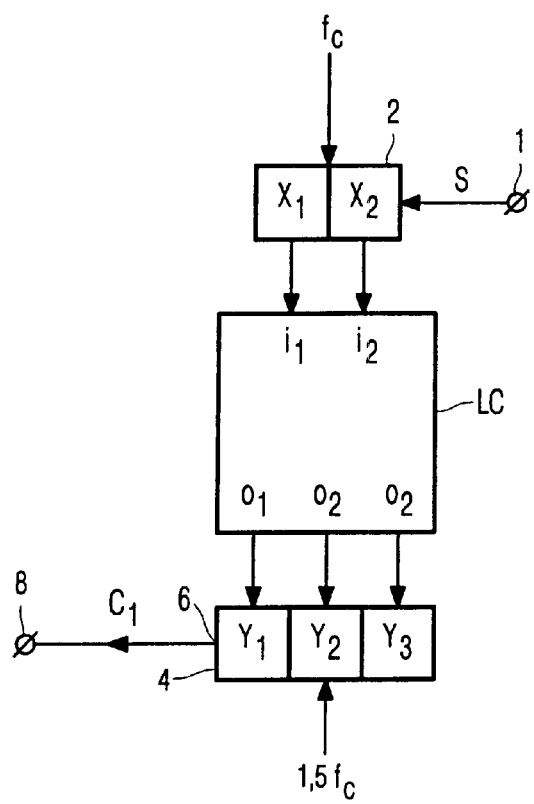
FIG. 1 shows a first.

FIG. 1 shows a device having an input terminal 1, for receiving a stream of databits of a binary source signal S. The terminal 1 is coupled to an input of a shift register 2 having two cells $X_1$ and $X_2$ so as to receive two consecutive source bits of the source signal S. The shift register 2 functions as a serial-parallel converter, so as to obtain consecutive 2-bit source words SW. The outputs of the two cells are coupled to two inputs $i_1$, $i_2$ of a logic circuit LC, for supplying the logic values $(x_1,x_2)$ of the source bits present in the cells to the logic circuit LC.

The device further includes a second shift register 4 having three cells $Y_1$, $Y_2$ and $Y_3$. Outputs $o_1$, $o_2$ and $o_3$ of the logic circuit LC are coupled to inputs of the three cells $Y_1$, $Y_2$ and $Y_3$ respectively of the shift register 4 for supplying the logic values $(y_1,y_2,y_3)$ of the channel words. An output 6 of the shift register 4 is coupled to an output terminal 8. The shift register 4 functions as a parallel-serial converter, so as to convert the 3-bit channel words CW supplied by the logic circuit LC into a serial stream of databits of a binary channel signal C.

The logic circuit LC is adapted to convert consecutive 2-bit source words SW into 3-bit channel words, such that the conversion for each 2-bit source word is parity inverting. That means that the number of 'ones' in the source word to be converted is the 'inverse' of the number of 'ones' in the corresponding channel word, if necessary, after having carried out a modulo-2 addition on the 'ones' in the channel word. Or, otherwise said: if the number of 'ones' in the source word is even, the number of 'ones' in the channel word will be odd. And: if the number of 'ones' in the source word is odd, the number of 'ones' in the channel word will be even.

As an example, the converting means LC is adapted to convert the 2-bit source words SW into 3-bit channel words CW in accordance with the following table:

TABLE I

| source word $(x_1,x_2)$ | | channel word $(y_1,y_2,y_3)$ | |
|---|---|---|---|
| $SW_1$ | 01 | $CW_1$ | 101 |
| $SW_2$ | 00 | $CW_2$ | 100 |
| $SW_3$ | 11 | $CW_3$ | 001 |
| $SW_4$ | 10 | $CW_4$ | 000 |

It should be noted here, that the first bit in the source word is applied first to the shift register 2 and that the first bit in the channel word is supplied first from the output 6 of the shift register 4.

The bitstream of the channel words is in NRZI (non-return to zero-inverse) notation, which means that a 'one' results in a transition in the write current for recording the channel signal on a magnetic record carrier.

The device of FIG. 1 can be used to generate a channel signal C in the form of a (d,k) sequence satisfying the d=1 constraint. That means that at least one 'zero' is present between two subsequent 'ones' in the serial datastream of the channel signal. That is, that a concatenation of two or more 'ones' in the channel signal is prohibited.

It might occur that the unmodified conversion, such as by means of the device of FIG. 1, of combinations of two subsequent 2-bit source words might violate the d=1 constraint. Those combinations are the combinations; '01 01', which by unmodified conversion would lead to the two 3-bit channel words '101 101'; '01 00', which by unmodified conversion would lead to the two 3-bit channel words '101 100'; '11 01', which by unmodified conversion would lead to the two 3-bit channel words '001 101' and '11 00', which by unmodified conversion would lead to the two 3-bit channel words '001 100'.

The occurrence of such combinations should be detected so that a modified encoding of blocks of two 2-bit source words into blocks of two 3-bit channel words can take place. A modified embodiment of a device of FIG. 1 which is, in addition to the 'normal' encoding of 2-bit source words into 3-bit channel words, capable of detecting the above identified combinations, and is capable of realizing a modified encoding, such that the d=1 constraint in the channel signal is still satisfied, is shown in FIG. 2a.

Figure 2A:
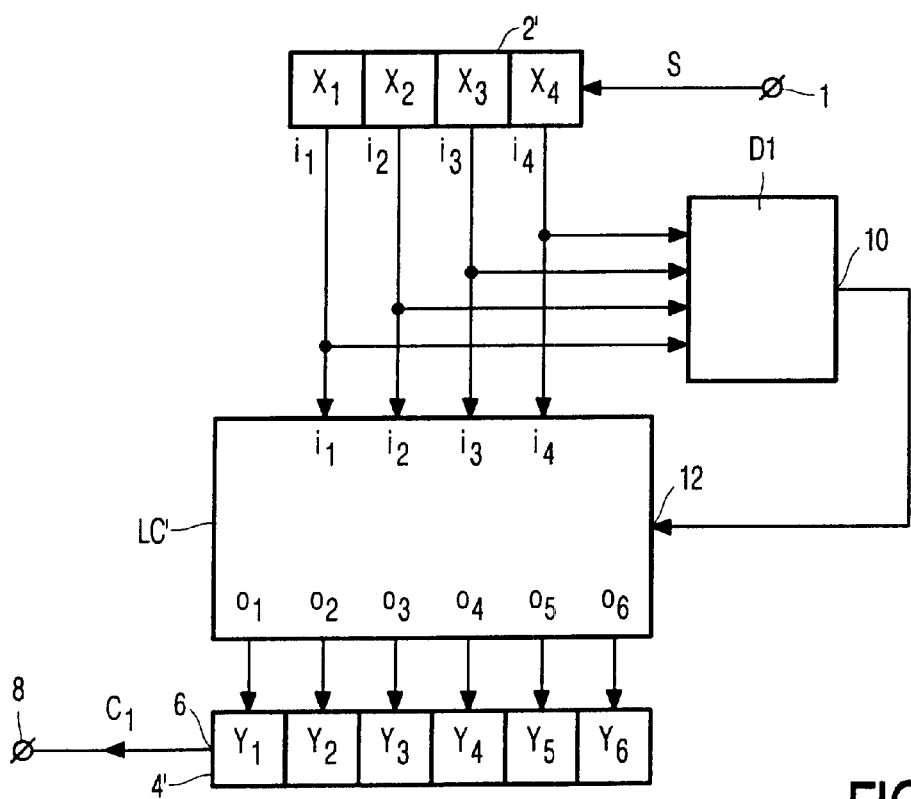
FIG. 2a shows a second.

The device of FIG. 2a includes a shift register having four cells $X_1$ to X4 so as to receive four consecutive bits $(x_1,x_2,x_3,x4)$ of the serial bitstream of the source signal S. Outputs of the four cells are coupled to corresponding inputs $i_1$ to $i_4$ respectively of the logic circuit LC'. The device further comprises detector unit D1. The detector unit D1 is adapted to detect the position in the serial bitstream of the source signal where unmodified encoding of single source words in the bitstream into corresponding single channel words would lead to a violation of the d=1 constraint in the channel signal C, and are adapted to supply a control signal at its output 10 in response to such detection.

The output 10 of the detector unit D1 is coupled to a control signal input 12 of the logic circuit LC'. The logic circuit LC' has six outputs $o_1$ to $o_6$, which are coupled to inputs of cells $Y_1$ to $Y_6$ respectively of second shift register 4'.

In the absence of a control signal at the control signal input 12, the logic circuit LC' converts the first 2-bit source word '$x_1$ $x_2$' into the three bit channel word '$y_1$ $y_2$ $y_3$' in conformity with table I given above. As soon as the detector circuit D1 detects a combination of two 2-bit source words $(x_1x_2,x_3,x_4)$ which equals one of the combinations given above, the logic circuit LC' converts the combination in accordance with the modified coding as given in the following table:

TABLE II

| source words | unmodified coding | modified coding |
|---|---|---|
| 01 01 | 101 101 | 100 010 |
| 01 00 | 101 100 | 101 010 |
| 11 01 | 001 101 | 000 010 |
| 11 00 | 001 100 | 001 010 |

As can be seen from the table, unmodified conversion of the single two 2-bit source words leads to a violation of the d=1 constraint, as two 'ones' occur at the boundary between the two channel words obtained. The logic circuit LC' is therefore adapted to convert in a modified coding mode, the blocks of two 2-bit source words given in the left column of the above table into the blocks of two 3-bit channel words as given in the right column in the above table II. As can be seen, no violation of the d=1 constraint occurs anymore. Moreover, the modified encoding in the same way is parity preserving. This is correct, for the reason that twice a parity inverting conversion of a 2-bit source word into a 3-bit channel word, leads to a parity preservation for the combined conversion.

This means in the present situation that, if the number of 'ones' in the blocks of two 2-bit source words is odd (even), the number of 'ones' in the block of two 3-bit channel words obtained is odd (even). Further, one of the two 2-bit source words, which is in the above table the second one, is encoded into a 3-bit channel word which is unequal to one of the four channel words of table I. The reason for this is that on the receiver side, a detection of this 3-bit channel word not belonging to the set of four 3-bit channel words of the table I is possible, so that a corresponding decoding, which is the inverse of the encoding as defined with reference to table II, can be realized.

The block of two 3-bit channel words obtained by means of the encoding in conformity with table II, is supplied by the logic circuit LC' to its outputs $o_1$ to $o_6$, which channel words are supplied to the six cells $Y_1$ to $Y_6$ of the shift register 4'. It is clear from the embodiment described that the situations where a modified encoding is needed is detected by means of the detector D1 using the source words.

Figure 2B:
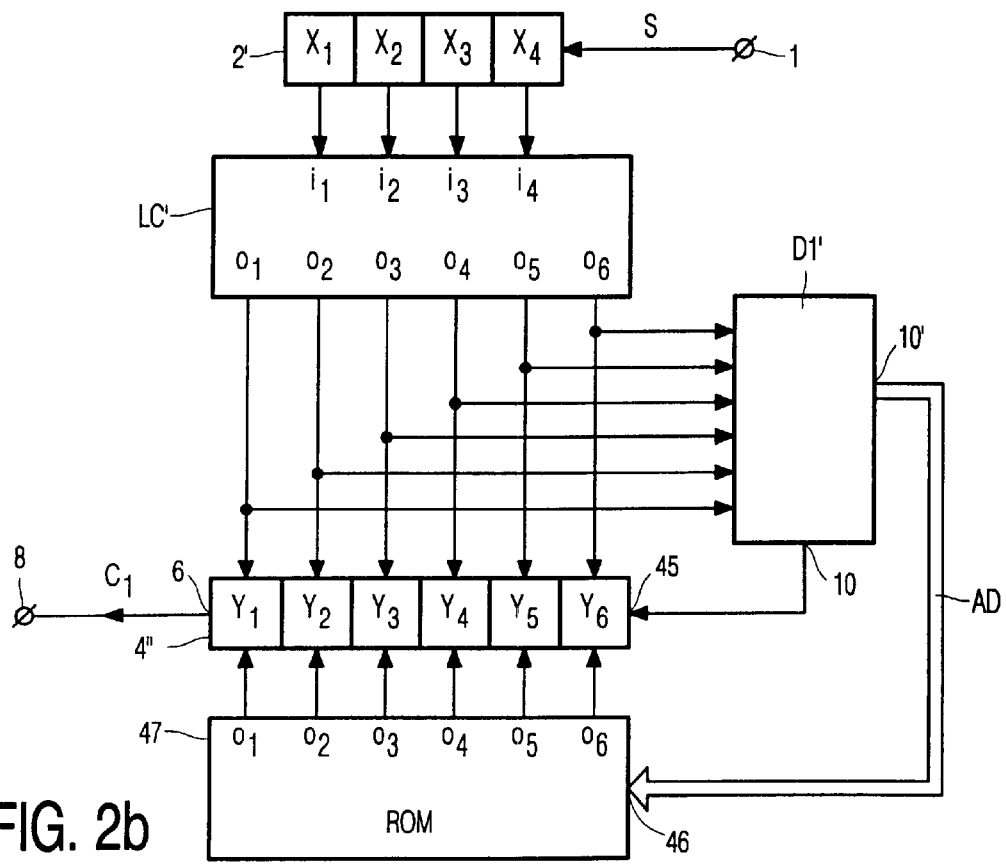
FIG. 2b a third.

A different construction of the device for carrying out the modified encoding described with reference to the table II is shown in FIG. 2b. In this case, detection of the situations where a modified coding should be carried out is decided using the converted channel words. The device of FIG. 2b includes a detector D1' having 6 inputs for receiving two subsequent 3-bit channel words obtained by means of the unmodified encoding. The detector D1' detects whether the two subsequent 3-bit channel words obtained using the unmodified coding equal one of the four 6-bit sequences given in the middle column under 'unmodified coding' of table II. If so, the detector D1' issues a switching signal at its output 10 and an address signal AD at its output 10'. The switching signal is applied to a switching signal input 45 of the shift register 4". The address signal AD is applied to an address signal input 46 of a ROM 47. The detector D1' generates one of four possible address signals AD1 to AD4, in response to the detection of a corresponding one of the four 6-bit sequences in the middle column of table II. As an example, the address signal AD1 is generated when the detector D1' detects the sequence '101 101' and generates the address signal AD4 upon detection of the 6-bit sequence '001100'. The ROM 47 has the 6-bit sequences shown in the right column of table II stored. Upon the receipt of the address signal AD1, the ROM supplies the 6-bit sequence '100 010' at its outputs $o_1$ to $o_6$, and upon the receipt of the address signal AD2, the ROM supplies the 6-bit sequence '101 010' at its outputs. Upon the receipt of the address signal AD3, the ROM supplies the 6-bit sequence '000 010' at its outputs, and upon the receipt of the address signal AD4, the ROM supplies the 6-bit sequence '001 010' at its outputs. Each memory location of the shift register 4" has now two inputs, one of them being coupled with a corresponding output of the logic circuit LC', the other being coupled to a corresponding output of the ROM 47.

In the normal situation, when the d=1 constraint is not violated, unmodified conversion is carried out, and the switching signal is absent so that the shift register accepts the bits supplied by the logic circuit LC' via the upper inputs of the shift register 4". If the d=1 constraint is violated, the switching signal applied to the switching signal input 45 results in the shift register to accept the 6-bit sequence, which is the modified sequence, applied by the ROM to the lower inputs of the shift register 4".

The k-constraint in a (d,k) sequence means that a concatenation of at most k 'zeroes' between two subsequent 'ones' in the channel signal are allowed.

It might occur that the unmodified conversion of three subsequent 2-bit source words might violate the k-constraint.

As an example: the sequence of source words '10 10 10' would by unmodified conversion lead to the three 3-bit channel words '000 000 000'. If a (d,k) sequence should be obtained where k equals 6, 7 or 8, such combination of three 3-bit channel words should not occur.

Another example is the sequence of source words '10 10 11' which by unmodified conversion would lead to the three 3-bit channel words '000 000 001'. This combination of three 3-bit channel words does not satisfy a k=6 or k=7 constraint. Moreover, this combination of three 3-bit channel words can follow a previous channel word that ends with a '0', so that it might lead to a violation of a k=8 constraint. Further, the combination ends with a '1', so that it might lead to a violation of the d=1 constraint, if the combination is followed by a 3-bit channel word that starts with a '1'. An equivalent reasoning is valid for the sequence of source words '00 10 10'.

A further example is the sequence of source words '00 10 11' which by unmodified conversion would lead to the three 3-bit channel words '100 000 001'. This combination can, in the same way as given above, lead to a violation of the d=1 constraint.

The occurrence of such combinations should be detected so that a modified encoding can take place. An embodiment of a device which is, in addition to the 'normal' encoding of 2-bit source words into 3-bit channel words, capable of detecting the above identified combinations, and is capable of realizing a modified encoding, is shown in FIG. 3.

Figure 3:
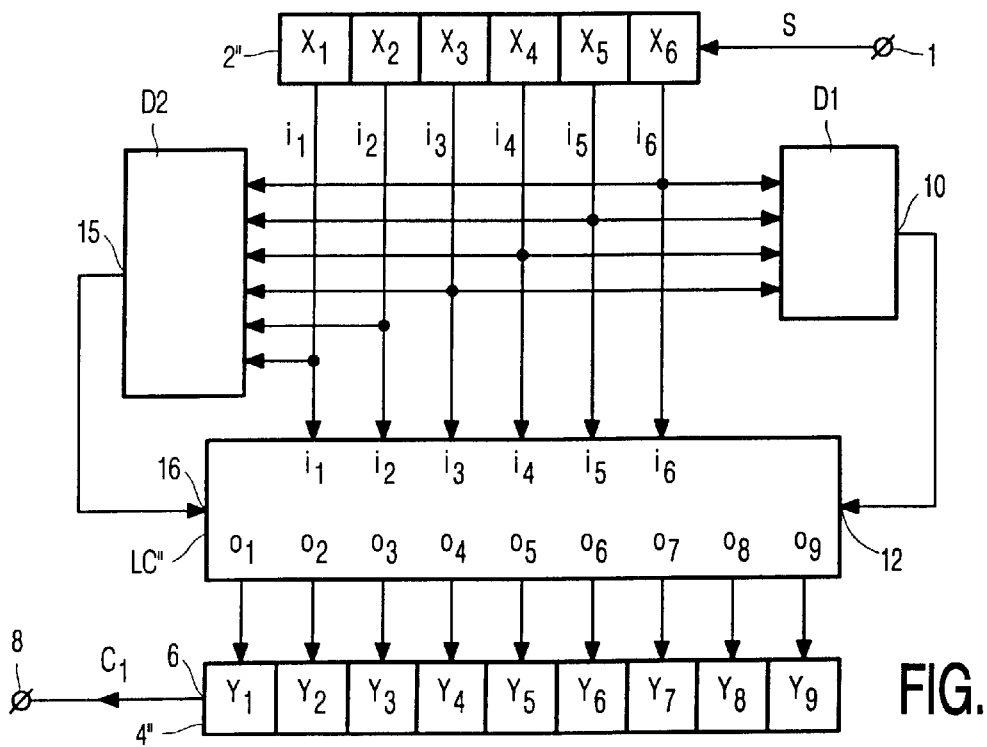
FIG. 3 shows a fourth embodiment of the device.

The device of FIG. 3 includes a shift register 2" having six cells $X_1$ to $X_6$ so as to receive six consecutive bits of the serial bitstream of the source signal S. Outputs of the six cells are coupled to corresponding inputs $i_1$ to $i_6$ respectively of the logic circuit LC". The device further comprises detector means D2. The detector means D2 are adapted to detect the position in the serial bitstream of the source signal where unmodified encoding of the bitstream would lead to a violation of the k-constraint in the channel signal C, and are adapted to supply a control signal at its output 15 in response to such detection.

The outputs of the six cells are also coupled to four inputs $i_1$ to $i_6$ respectively of logic circuit LC". The output 15 of the detector means D2 is coupled to a control signal input 16 of the logic circuit LC". The logic circuit LC" has nine outputs $o_1$ to $o_9$, which are coupled to inputs of cells $Y_1$ to $Y_9$ respectively of second shift register 4".

In the absence of a control signals at the control signal inputs 12 and 16, the logic circuit LC' converts a single 2-bit source word '$x_1 \, x_2$' into a single 3-bit channel word '$y_1 \, Y_2 \, y_3$' in conformity with table I given above. As soon as the detector circuit D1 detects a block of two 2-bit source words '$x_1 \, x_2, x_3 \, x_4$' which equals one of the combinations given in table II above, the logic circuit LC" converts the combination in accordance with the conversion rule as given in table II, so as to obtain a block of two 3-bit channel words '$y_{1 \, y2} \, y_3 \, y_4 \, y_5 \, y_6$'.

As soon as the detector D2 detects a block of three 2-bit source words '$x_1 \, x_2 \, x_3 \, x_4 \, x_5 \, x_6$' which equals one of the combinations given above, the logic circuit LC" converts the block in accordance with the modified coding as given in the following table, so as to obtain a block of three 3-bit channel words:

TABLE III

| source words | unmodified coding | modified coding |
|---|---|---|
| 10 10 10 | 000 000 000 | 000 010 010 |
| 10 10 11 | 000 000 001 | 001 010 010 |
| 00 10 11 | 100 000 001 | 101 010 010 |
| 00 10 10 | 100 000 000 | 100 010 010 |

The logic circuit LC" is adapted to convert in a modified coding mode, the blocks of three 2-bit source words given in the left column of the above table III into the blocks of three 3-bit channel words as given in the right column in the above table. By realizing the modified encoding as per table III, a channel signal has been obtained which satisfies the k=8 constraint. Moreover, the modified encoding in the same way is parity inverting. This means in the present situation that, if the number of 'ones' in the combination of three 2-bit source words is odd (even), the number of 'ones' in the combination of the three 3-bit channel words obtained is even (odd). Further, two of the three 2-bit source words, which is in the above table the second one and the third one, is encoded into a 3-bit channel word which is unequal to one of the four channel words of table I. The reason for this is that on the receiver side, a detection of these two consecutive 3-bit channel words not belonging to the set of four 3-bit channel words of the table I is possible, so that a corresponding decoding, which is the inverse of the encoding as defined with reference to table III, can be realized.

The combination of three 3-bit channel words obtained by means of the encoding in conformity with table III, is supplied by the logic circuit LC" to its outputs $o_1$ to $o_9$, which channel words are supplied to the nine cells $Y_1$ to $Y_9$ of the shift register 4". The serial datastream of the channel signal C is supplied to the output terminal 8.

It will be evident that, in the same way as described with reference to FIG. 2b, the detection of the violation of the k-constraint can be done on the channel signal level, instead of the source signal level.

It has been said previously that other conversion rules for converting single 2-bit source words into single 3-bit channel words are possible. Those conversion rules are given in the following three tables.

TABLE IV

| source word $(x_1,x_2)$ | | channel word $(y_1,y_2,y_3)$ | |
|---|---|---|---|
| $SW_1$ | 01 | $CW_1$ | 101 |
| $SW_2$ | 00 | $CW_2$ | 001 |
| $SW_3$ | 11 | $CW_3$ | 100 |
| $SW_4$ | 10 | $CW_4$ | 000 |

TABLE V

| source word $(x_1,x_2)$ | | channel word $(y_1,y_2,y_3)$ | |
|---|---|---|---|
| $SW_1$ | 01 | $CW_1$ | 000 |
| $SW_2$ | 00 | $CW_2$ | 100 |
| $SW_3$ | 11 | $CW_3$ | 001 |
| $SW_4$ | 10 | $CW_4$ | 101 |

TABLE VI

| source word $(x_1,x_2)$ | | channel word $(y_1,y_2,y_3)$ | |
|---|---|---|---|
| $SW_1$ | 01 | $CW_1$ | 000 |
| $SW_2$ | 00 | $CW_2$ | 001 |
| $SW_3$ | 11 | $CW_3$ | 100 |
| $SW_4$ | 10 | $CW_4$ | 101 |

It is evident that extensions of those conversion rules for encoding blocks of two or three 2-bit source words into blocks of two or three 3-bit channel words can be obtained using the teachings given above.

A further embodiment of an encoder is explained with reference to the following table VII. This table shows the conversion rule for an encoder capable of encoding 3-bit source words into 4-bit channel words.

TABLE VII

| source word $(x_1,x_2,x_3)$ | | channel word $(y_1,y_2,y_3,y_4)$ | |
|---|---|---|---|
| $SW_1$ | 001 | $CW_1$ | 0000 |
| $SW_2$ | 000 | $CW_2$ | 0001 |
| $SW_3$ | 011 | $CW_3$ | 0100 |
| $SW_4$ | 010 | $CW_4$ | 0101 |
| $SW_5$ | 101 | $CW_5$ | 1000 |
| $SW_6$ | 100 | $CW_6$ | 1001 |
| $SW_7$ | 111 | $CW_7$ | 1010 |
| $SW_8$ | 110 | $CW_8$ | 0010 |

Figure 4:
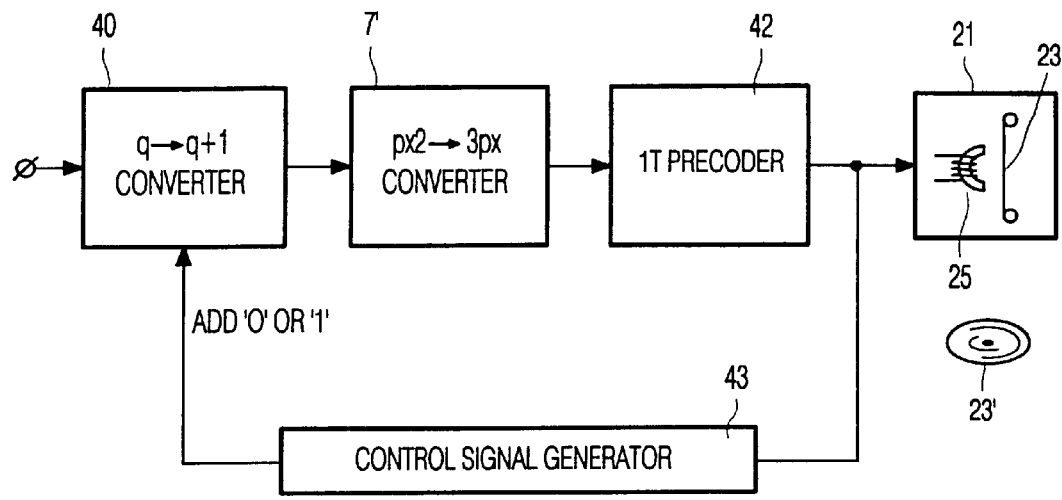
FIG. 4 the application of the device in an arrangement for inserting one bit on equidistant positions in the serial source signal, and FIG. 5 an embodiment of the decoding device.

As has been said previously, the devices described above are very suitable in combination with a converter unit in which one bit is inserted after each q bits in a serial datastream in order to realize a polarity conversion, or not. FIG. 4 shows such combination, where the converter unit 40 is followed by the device 7' in accordance with the present invention 41, which device 7' is subsequently followed by a 1T-precoder 42, well known in the art. The output signal of the 1T-precoder 42 is applied to a control signal generator 43, which generates the control signal for the converter unit 40, so as to control whether a '0' or a '1' is inserted in the serial datastream applied to the device 7'. Inserting a '0' or a '1' bit always leads to either an increase and decrease, respectively, or vice versa, in the running digital sum value at the output of the precoder 42.

By means of the arrangement shown in FIG. 4 it is possible to embed a tracking tone of a certain frequency in the serial datastream, or keep the DC content of the datastream to zero. Further, when the device 7' is adapted to generate a (d,k) sequence as explained above, it causes the output signal of the arrangement of FIG. 4 to be a (d,k) RLL output signal. Embodiments of the converter 40 are given in Bell System Technical Journal, Vol 53 No. 6, pp. 1103–1106.

Figure 5:
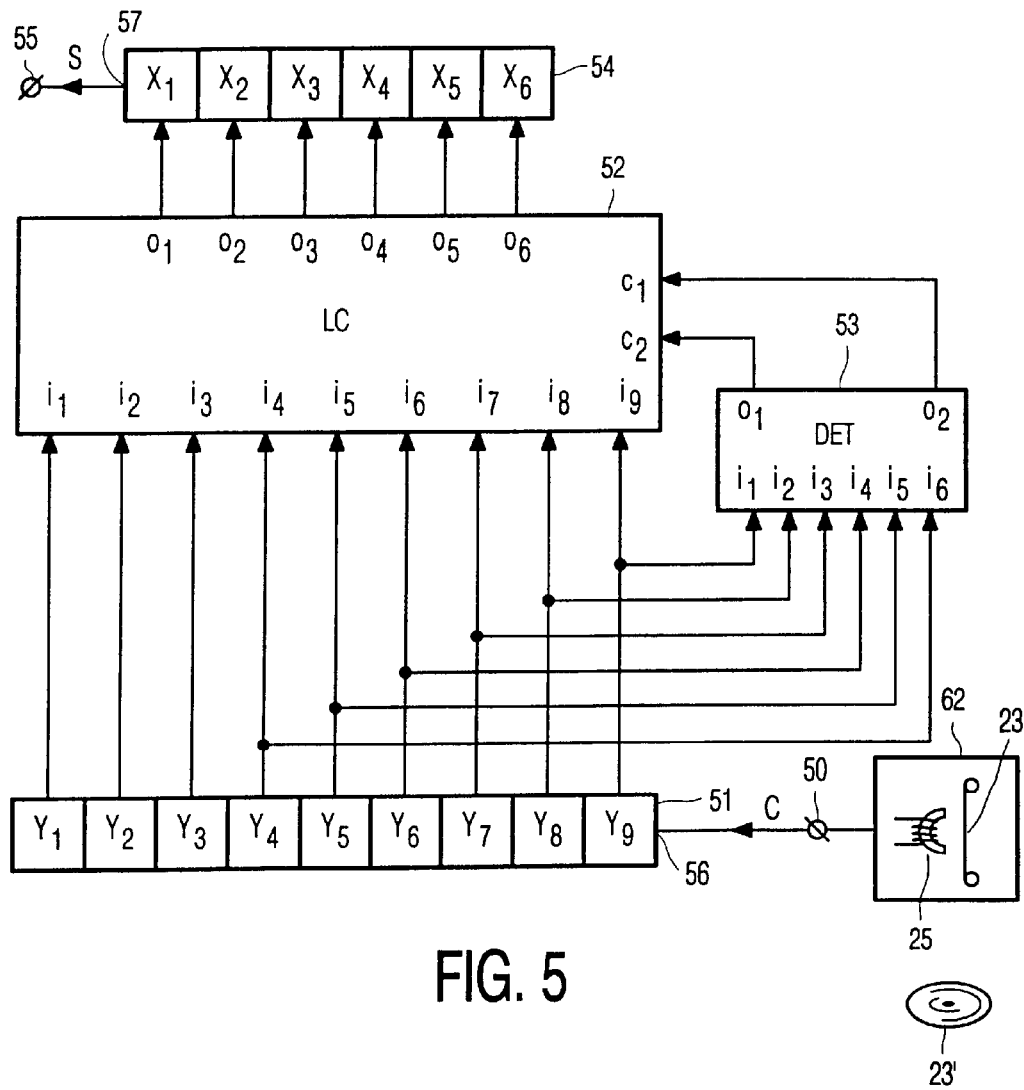

FIG. 5 shows a decoding device for decoding the serial datastream obtained by the encoding device of FIG. 3 so as to obtain a binary source signal. The decoding device has an input terminal 50 for receiving the channel signal, which input terminal 50 is coupled to an input 56 of a shift register 51 comprising nine cells $Y_1$ to $Y_9$. The shift register 51 functions as a serial-parallel converter so that blocks of three 3-bit channel words are applied to inputs $i_1$ to $i_9$ of a logic circuit 52 The logic circuit 52 comprises the three tables I, II and III. Outputs $o_1$ to $o_6$ of the logic circuit 52 are coupled to inputs of cells $X_1$ to $X_6$ of a shift register 54 which has an output 57 coupled to an output terminal 55 A detector circuit 53 is present having inputs $i_1$ to $i_6$ coupled to outputs of cells $Y_4$ to $Y_9$ respectively of the shift register 51 and outputs $o_1$ and $o_2$ coupled to control inputs $c_1$ and $c_2$ respectively of the logic circuit 52 The detector circuit 53 is capable of detecting a '010' bit pattern in the cells $Y_4$, $Y_5$ and $Y_6$ of the shift register 51 and is capable of detecting a bit pattern '010010' in the cells $Y_4$ to $Y_9$ of the shift register 51

Upon detection of the '010010' bitpattern, the detector circuit 53 generates a control signal on its output $o_2$, and upon detection of a '010' bit pattern in the cells $Y_4$, $Y_5$ and $Y_6$, whilst there is no '010' bit pattern in the cells $Y_7$, $Y_8$ and $Y_9$, it generates a control signal on its output $o_1$.

In the absence of the control signals, the logic circuit 52 converts the 3-bit channel word stored in the cells $Y_1$, $Y_2$ and $Y_3$ into its corresponding 2-bit source word, as per the conversion table I, and supplies the 2-bit source word to the cells $X_1$ and $X_2$. In the presence of the control signal at the input $c_1$, the logic circuit 52 converts the block of two 3-bit channel words stored in the cells $Y_1$ to $Y_6$ into a block of two 2-bit source words, as per the conversion table II, and supplies the two 2-bit source words to the cells $X_1$ to $X_4$. In the presence of the control signal at the input $c_2$, the logic circuit 52 converts the block of three 3-bit channel words stored in the cells $Y_1$ to $Y_9$ into a block of three 2-bit source words, as per the conversion table III, and supplies the three 2-bit source words to the cells $X_1$ to $X_6$. In this way, the serial datastream of the channel signal is converted into the serial datastream of the source signal.

The encoded information supplied to the input 50 could have been obtained from reproducing the information from a record carrier, such as a magnetic record carrier 23 or an optical record carrier 23'. The device of FIG. 5 thereto comprises a read unit 62 form reading the information from a track on the record carrier, where the unit 62 comprises a read head 64 for reading the information from said track.

Next, another parity inverting 2-to-3 bit conversion code will be described, resulting in a (1,7) sequence. The main conversion table is as follows:

| source word | | Channel word | |
|---|---|---|---|
| $SW_1$ | 01 | $CW_1$ | x0x |
| $SW_2$ | 00 | $CW_2$ | 001 |
| $SW_3$ | 11 | $CW_3$ | 010 |

In this table, conversion of the source word '01' is dependent of the last bit of the channel word obtained from converting the directly preceding 2-bit source word. When this last bit is a '0' bit, the conversion results into the 3-bit word '101' and when this last bit is a '1' bit, the conversion results into the 3-bit word '000'.

A first substitution table is present for converting specific blocks of two 2-bit source words. This first substitution table is as follows:

| block of 2 source words | block of 2 channel words |
|---|---|
| 10 01 | 010 100 |
| 10 00 | 010 000 |
| 10 11 | 000 100 |

A second substitution table is present for converting specific blocks of three 2-bit source words. This second substitution table is as follows:

| block of 3 source words | block of 3 channel words |
|---|---|
| 10 10 01 | 000 100 100 |
| 10 10 00 | 001 100 000 |
| 10 10 11 | 010 100 100 |
| 10 10 10 | 010 100 000 |

A third substitution table is present for converting specific blocks of four 2-bit source words. This third substitution table is as follows:

| block of 4 source words | block of 4 channel words |
|---|---|
| 10 10 00 10 | 000 100 100 100 |
| 10 10 10 10 | 010 100 100 100 |

Further, unmodified conversion of the following sequence 01 11 01 xy could lead to the following channel sequence: 101 010 101 010, where the conversion of the first 2-bit source word apparently led to the 3-bit channel word '101' and xy is a 2-bit source word leading to the 3-bit channel word '010'. Such sequence is unwanted, as it violates a requirement for the length of a repeated minimum transition runlength (RMTR). Therefore, upon occurrence of such sequence, this sequence is converted into the sequence 001 000 000 010.

Whilst the invention has been described with reference to preferred embodiments thereof, it is to be understood that these are not limitative examples. Thus, various modifications may become apparent to those skilled in the art, without departing from the scope of the invention, as defined by the claims. As an example, the decoding device of FIG. 5 could be modified into a device in which the detector 53 detects the various modified decoding situations from the decoded information, instead from the encoded information, as disclosed in FIG. 5. It should further be noted that, as an example, the converter unit 7' and the precoder 42 could have been into one combined unit, where, dependent of incoming n-bit source words, via a conversion table, those n-bit source words are directly converted into 3-bit output words of the combined unit. Further, it should be noted that the parity inverting conversion as claimed could have been obtained by applying a parity preserving coder, such as described in U.S. Pat. No. 5,477,222, and EXORing the 2-bit source words with either '10' or '01' (EXORing, in the sense of: msb of the 2-bit source word with the msb of '10' or '01', and lsb of the 2-bit source word with the lsb of '10' or '01'), prior to applying the 2-bit source words to the parity preserving coder.

Further, any reference signs do not limit the scope of the claims. The invention can be implemented by means of both hardware and software, and several "means" may be represented by the same item of hardware. The word 'comprising' does not exclude the presence of other elements or steps than those listed in a claim. Also, the word "a" or "an" preceding an element does not exclude the presence of a plurality of such elements. In addition, the invention lies in each and every novel feature or combination of features.

What is claimed is:

1. An encoding device comprising:
    an input for a stream of data-bits of a binary source signal divided into consecutive n-bit source words; and
    converting means for converting blocks of p source words of the consecutive n-bit source words into corresponding blocks of p consecutive m-bit channel words, such that the conversion for each block of p consecutive n-bit source words is parity inverting, where n, m and p are integers, $m>n\geq1$, $p\geq1$, and where p is an odd integer and can vary.

2. The device of claim 1, in which m=n+1.

3. The device of claim 2, in which n=2.

4. The device of claim 1, in which the converting means convert single source words into corresponding single channel words in accordance with the following table:

| source word | | Channel word | |
|---|---|---|---|
| $SW_1$ | 00 | $CW_1$ | 100 |
| $SW_2$ | 01 | $CW_2$ | 101 |
| $SW_3$ | 10 | $CW_3$ | 000 |
| $SW_4$ | 11 | $CW_4$ | 001. |

5. A method, comprising the steps of:
    a providing a stream of data-bits of a binary source signal divided into n-bit source words; and
    converting said source words into corresponding m-bit channel words, a block of p consecutive n-bit source words into a corresponding block of p consecutive m-bit channel words, such that the conversion for each block of p consecutive n-bit source words is parity inverting, where n, m and p are integers, $m>n\geq1$, $p\geq1$, and where p can vary.

6. A decoding device comprising:
    an input for a stream of data bits of a binary channel signal divided into consecutive m-bit channel words;
    de-converting means for de-converting blocks of p channel words of the consecutive m-bit channel words into corresponding blocks of p consecutive n-bit source words, such that the conversion for each block of p consecutive m-bit channel words is parity inverting, where n, m and p are integers, $m>n$, $p\geq1$, and where p is an odd integer and can vary.

7. The device of claim 3, wherein:
    the converting means convert 2-bit source words into corresponding 3-bit channel words, so as to obtain a channel signal in the form of a (d,k) sequence, whered=1;
    the device further comprises means for detecting the position in the bitstream of the source signal where encoding of single 2-bit source words into corresponding single channel words would lead to a violation of the d-constraint at the channel word boundaries and for supplying a control signal in response to the detection; and in the absence of the control signal, the converting means convert single 2-bit source words into corresponding single 3-bit channel words, such that the conversion for each 2-bit source word is parity inverting.

8. Device as claimed in claim 7, wherein:

in the presence of the control signal, occurring during the conversion of two consecutive source words, the converting means convert a block of the two consecutive 2-bit source words into a block of two corresponding 3-bit channel words, such that one of the two source words in the block of source words is converted into a 3-bit channel word which is not identical to one of the four channel words CW1 to CW4, in order to preserve the d=1 constraint; and in the presence of the control signal, the converting means convert the block of the two subsequent 2-bit source words into a corresponding block of two subsequent 3-bit channel words, such that the conversion for the block of two subsequent 2-bit source words is parity preserving.

9. The device of claim 1, in which the converting means convert blocks of two consecutive 2-bit source words into blocks of two consecutive 3-bit channel words in accordance with the coding given in the following table:

| block of 2 source words | block of 2 channel words |
|---|---|
| 01 01 | 100 010 |
| 01 00 | 101 010 |
| 11 01 | 000 010 |
| 11 00 | 001 010. |

10. The device of claim 1, in which:

k has a value larger than 5;

the device further comprises means for detecting the position in the bitstream of the source signal where encoding of single 2-bit source words into single 3-bit channel words would lead to a violation of the k-constraint and for supplying a second control signal in response to the detection;

in the presence of the second control signal, occurring during the conversion of three consecutive 2-bit source words, the converting means convert a block of the three consecutive 2-bit source words into a block of corresponding three consecutive 3-bit channel words, such that the conversion for the block of three 2-bit source words is parity inverting; and the converting means convert two of the three source words in the block into corresponding 3-bit channel words not identical to the four channel words $CW_1$ to $CW_4$, in order to preserve the k constraint.

11. The device of claim 1, in which the converting means convert blocks of three consecutive 2-bit source words into blocks of three consecutive 3-bit channel words in accordance with,the coding given in the following table:

| block of 3 source words | block of 3 channel words |
|---|---|
| 10 10 10 | 000 010 010 |
| 10 10 11 | 001 010 010 |
| 00 10 11 | 101 010 010 |
| 00 10 10 | 100 010 010. |

12. The device of claim 1 in which the conversion means carry out a signal processing on the binary source signal equivalent to the conversion of the blocks of-p consecutive source words into the blocks of p consecutive channel words, followed by an aT pre-coding of the channel words.

13. The device of claim 1, in which the device further comprises bit adding means for adding one bit to subsequent blocks of q bits of the source signal.

14. The device of claim 1 in which it further comprises means for recording the stream of data-bits of the binary channel signal in a track on the record carrier.

15. The device of claim 1, in which:

m=n+1;

n=2;

the converting means convert single source words into corresponding single channel words in accordance with the following table:

| source word | | Channel word | |
|---|---|---|---|
| $SW_1$ | 00 | $CW_1$ | 100 |
| $SW_2$ | 01 | $CW_2$ | 101 |
| $SW_3$ | 10 | $CW_3$ | 000 |
| $SW_4$ | 11 | $CW_4$ | 001 | the converting means convert 2-bit source words into corresponding 3-bit channel words, so as to obtain a channel signal in the form of a (d,k) sequence, where d=1;

the device further comprises means for detecting the position in the bitstream of the source signal where encoding of single 2-bit source words into corresponding single channel words would lead to a violation of the d-constraint at the channel word boundaries and for supplying a control signal in response to the detection;

in the absence of the control signal, the converting means convert single 2-bit source words into corresponding single 3-bit channel words, such that the conversion for each 2-bit source word is parity inverting;

in the presence of the control signal, occurring during the conversion of two consecutive source words, the converting means convert a block of the two consecutive 2-bit source words into a block of two corresponding 3-bit channel words, such that one of the two source words in the block of source words is converted into a 3-bit channel word which is not identical to one of the four channel words CW1 to CW4, in order to preserve the d=1 constraint;

in the presence of the control signal, the converting means convert the block of the two subsequent 2-bit source words into a corresponding block of two subsequent 3-bit channel words, such that the conversion for the block of two subsequent 2-bit source words is parity preserving;

the converting means convert blocks of two consecutive 2-bit source words into blocks of two consecutive 3-bit channel words in accordance with the coding given in the following table:

| block of 2 source words | block of 2 channel words |
| --- | --- |
| 01 01 | 100 010 |
| 01 00 | 101 010 |
| 11 01 | 000 010 |
| 11 00 | 001 010 | k has a value larger than 5;

the device further comprises means for detecting the position in the bitstream of the source signal where encoding of single 2-bit source words into single 3-bit channel words would lead to a violation of the k-constraint and for supplying a second control signal in response to the detection;

in the presence of the second control signal, occurring during the conversion of three consecutive 2-bit source words, the converting means convert a block of the three consecutive 2-bit source words into a block of corresponding three consecutive 3-bit channel words, such that the conversion for the block of three 2-bit source words is parity inverting;

the converting means convert two of the three source words in the block into corresponding 3-bit channel words not identical to the four channel words CW1 to CW4, in order to preserve the k constraint;

the converting means convert blocks of three consecutive 2-bit source words into blocks of three consecutive 3-bit channel words in accordance with the coding given in the following table:

| block of 3 source words | block of 3 channel words |
| --- | --- |
| 10 10 10 | 000 010 010 |
| 10 10 11 | 001 010 010 |
| 00 10 11 | 101 010 010 |
| 00 10 10 | 100 010 010 | the conversion means carry out a signal processing on the binary source signal equivalent to the conversion of the blocks of p consecutive source words into the blocks of p consecutive channel words, followed by an aT pre-coding of the channel words;

the device further comprises bit adding means for adding one bit to subsequent blocks of q bits of the source signal; and the device further comprises means for recording the stream of data-bits of the binary channel signal in a track on the record carrier.

16. The method of claim 5, in which:

m=n+1;

n=2;

the converting step converts single source words into corresponding single channel words in accordance with the following table:

| source word | | Channel word | |
| --- | --- | --- | --- |
| $SW_1$ | 00 | $CW_1$ | 100 |
| $SW_2$ | 01 | $CW_2$ | 101 |

-continued

| source word | | Channel word | |
| --- | --- | --- | --- |
| $SW_3$ | 10 | $CW_3$ | 000 |
| $SW_4$ | 11 | $CW_4$ | 001 | the converting step converts 2-bit source words into corresponding 3-bit channel words, so as to obtain a channel signal in the form of a (d,k) sequence, where d=1;

the method further comprises detecting the position in the bitstream of the source signal where encoding of single 2-bit source words into corresponding single channel words would lead to a violation of the d-constraint at the channel word boundaries and for supplying a control signal in response to the detection;

in the absence of the control signal, the converting step converts single 2-bit source words into corresponding single 3-bit channel words, such that the conversion for each 2-bit source word is parity inverting;

in the presence of the control signal, occurring during the conversion of two consecutive source words, the converting step converts a block of the two consecutive 2-bit source words into a block of two corresponding 3-bit channel words, such that one of the two source words in the block of source words is converted into a 3-bit channel word which is not identical to one of the four channel words CW1 to CW4, in order to preserve the d=1 constraint;

in the presence of the control signal, the converting step converts the block of the two subsequent 2-bit source words into a corresponding block of two subsequent 3-bit channel words, such that the conversion for the block of two subsequent 2-bit source words is parity preserving;

the converting step converts blocks of two consecutive 2-bit source words into blocks of two consecutive 3-bit channel words in accordance with the coding given in the following table:

| block of 2 source words | block of 2 channel words |
| --- | --- |
| 01 01 | 100 010 |
| 01 00 | 101 010 |
| 11 01 | 000 010 |
| 11 00 | 001 010 | k has a value larger than 5;

the method further comprises detecting the position in the bitstream of the source signal where encoding of single 2-bit source words into single 3-bit channel words would lead to a violation of the k-constraint and for supplying a second control signal in response to the detection;

in the presence of the second control signal, occurring during the conversion of three consecutive 2-bit source words, the converting step converts a block of the three consecutive 2-bit source words into a block of corresponding three consecutive 3-bit channel words, such that the conversion for the block of three 2-bit source words is parity inverting;

the converting step converts two of the three source words in the block into corresponding 3-bit channel words not identical to the four channel words CW1 to CW4, in order to preserve the k constraint;

the converting step converts blocks of three consecutive 2-bit source words into blocks of three consecutive 3-bit channel words in accordance with the coding given in the following table:

| block of 3 source words | block of 3 channel words |
|---|---|
| 10 10 10 | 000 010 010 |
| 10 10 11 | 001 010 010 |
| 00 10 11 | 101 010 010 |
| 00 10 10 | 100 010 010 | the conversion step carries out signal processing on the binary source signal equivalent to the conversion of the blocks of p consecutive source words into the blocks of p consecutive channel words, followed by an aT precoding of the channel words;

the method further comprises bit adding one bit to subsequent blocks of q bits of the source signal; and the method further comprises recording the stream of data-bits of the binary channel signal in a track on the record carrier.

17. The decoding device of claim 6, in which:

$n \geq 1$;

$m = n+1$;

$n = 2$;

the de-converting means de-convert single channel words into corresponding single source words in accordance with the following table:

| channel word | | source word | |
|---|---|---|---|
| $CW_1$ | 100 | $SW_1$ | 00 |
| $CW_2$ | 101 | $SW_2$ | 01 |
| $CW_3$ | 000 | $SW_3$ | 10 |
| $CW_4$ | 001 | $SW_4$ | 11 | the de-converting means de-convert 3-bit channel words in a channel signal in the form of a (d,k) sequence, where d=1, into corresponding 2-bit source words;

the decoding device further comprises means for detecting the position in the bitstream of the channel signal where the encoding of single 2-bit source words into corresponding single channel words would have lead to a violation of the d-constraint at the channel word boundaries and for supplying a control signal in response to the detection; and in the absence of the control signal, the de-converting means de-convert single 3-bit channel words into corresponding single 2-bit source words, such that the conversion for each 2-bit channel word is parity inverting;

in the presence of the control signal, occurring during the conversion of two consecutive channel words, the de-converting means de-convert a block of the two consecutive 3-bit channel words into a block of two corresponding 2-bit source words, where one of the two channel words in the block of channel words is not identical to one of the four channel words CW1 to CW4, in order to preserve the d=1 constraint;

in the presence of the control signal, the de-converting means de-convert the block of the two subsequent 3-bit channel words into a corresponding block of two subsequent 2-bit source words, such that the de-conversion for the block of two subsequent 3-bit channel words is parity preserving;

the de-converting means de-convert blocks of two consecutive 3-bit channel words into blocks of two consecutive 2-bit source words in accordance with the coding given in the following table:

| block of 2 channel words | block of 2 source words |
|---|---|
| 100 010 | 01 01 |
| 101 010 | 01 00 |
| 000 010 | 11 01 |
| 001 010 | 11 00 | k has a value larger than 5;

the device further comprises means for detecting the position in the bitstream of the channel signal where encoding of single 2-bit source words into single 3-bit channel words during encoding would have lead to a violation of the k-constraint and for supplying a second control signal in response to the detection;

in the presence of the second control signal, occurring during the conversion of three consecutive 3-bit channel words, the de-converting means de-convert a block of the three consecutive 3-bit channel words into a block of corresponding three consecutive 2-bit source words, such that the conversion for the block of three 3-bit channel words is parity inverting;

the de-converting means de-convert two of the three 3-bit channel words in the block that are not identical to the four channel words CW1 to CW4, in order to preserve the k constraint, into corresponding 2-bit source words;

the de-converting means de-convert blocks of three consecutive 3-bit channel words into blocks of three consecutive 2-bit source words in accordance with the coding given in the following table:

| block of 3 channel words | block of 3 source words |
|---|---|
| 000 010 010 | 10 10 10 |
| 001 010 010 | 10 10 11 |
| 101 010 010 | 00 10 11 |
| 100 010 010 | 00 10 10 | the conversion means carry out a signal processing on the binary source signal equivalent to aT decoding of the channel words followed by the conversion of the blocks of p consecutive channel words into the blocks of p consecutive source words;

the device further comprises bit subtracting means for subtracting one bit from subsequent blocks of q bits of the channel signal; and the device further comprises means for reading the stream of data-bits of the binary channel signal from a track on a record carrier.

18. The device of claim 1, further an output for a stream of data-bits of a binary channel signal divided into the consecutive m-bit channel words.

19. The method of claim 5, further comprising transmitting a stream of data-bits of the m-bit channel words.

20. The device of claim 6, further comprising an output for a stream of data bits of a binary source signal divided into the consecutive n-bit source words.

* * * * *

UNITED STATES PATENT AND TRADEMARK OFFICE
CERTIFICATE OF CORRECTION

PATENT NO. : 6,597,297 B1
DATED : July 22, 2003
INVENTOR(S) : Josephus A.H.M. Kalhman It is certified that error appears in the above-identified patent and that said Letters Patent is hereby corrected as shown below:

<u>Title page,</u>
Item [75], please amend the inventor's name to read as follows:
-- Josephus A.H.M. Kahlman --

Signed and Sealed this

Twenty-ninth Day of June, 2004

JON W. DUDAS
*Acting Director of the United States Patent and Trademark Office*